United States Patent
Yuan et al.

(10) Patent No.: US 6,677,247 B2
(45) Date of Patent: Jan. 13, 2004

(54) METHOD OF INCREASING THE ETCH SELECTIVITY OF A CONTACT SIDEWALL TO A PRECLEAN ETCHANT

(75) Inventors: Zheng Yuan, Fremont, CA (US); Steve Ghanayem, Los Altos, CA (US); Randhir P. S. Thakur, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 171 days.

(21) Appl. No.: 10/041,550

(22) Filed: Jan. 7, 2002

(65) Prior Publication Data

US 2003/0127427 A1 Jul. 10, 2003

(51) Int. Cl.[7] ............................................... H01L 21/00

(52) U.S. Cl. ...................... 438/723; 438/724; 438/743; 438/744; 438/745; 134/1.3; 216/39; 216/79

(58) Field of Search ................................. 438/692, 723, 438/724, 743, 744, 745, 756, 757; 216/2, 38, 39, 67, 79, 88, 99; 134/1.2, 1.3

(56) References Cited

PUBLICATIONS

E. P. Gusev et al., "Growth and Characterization of Ultrathin Nitrided Silicon Oxide Films," *IBM J. Res. Develop.*, vol. 43, No. 3, pp. 265–286 (May 1999).

*Primary Examiner*—William A. Powell
(74) *Attorney, Agent, or Firm*—Townsend & Townsend and Crew

(57) ABSTRACT

A method of forming a contact in an integrated circuit between a first metalization layer and a silicon substrate. In one embodiment the method comprises forming a premetal dielectric layer over the silicon substrate, etching a contact hole through the premetal dielectric layer and then forming a thin silicon nitride layer on an outer surface of the contact hole. The silicon nitride layer reduces overetching that may otherwise occur when oxidation build-up is removed from the silicon interface within the contact hole by a preclean process. After the preclean process, the contact hole is then filled with one or more conductive materials. In various embodiments the silicon nitride layer is formed by exposing the contact hole to a nitrogen plasma, depositing the layer by a chemical vapor deposition process and depositing the layer by an atomic layer deposition process. In other embodiments, the method is applicable to the formation of vias through intermetal dielectric layers.

24 Claims, 5 Drawing Sheets

METHOD OF INCREASING THE ETCH SELECTIVITY OF A CONTACT SIDEWALL TO A PRECLEAN ETCHANT

CROSS-REFERENCES TO RELATED APPLICATIONS

NOT APPLICABLE

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention relates to the formation of integrated circuits on semiconductor wafers. More particularly, embodiments of the invention relate to a method for forming high aspect ratio contacts to a silicon substrate through an overlying borophosphosilicate glass or similar silicon oxide layer.

Borophosphosilicate glass (hereinafter "BPSG") has found wide use in the semiconductor industry as a separation layer between the polysilicon gate/interconnect layer and the first metal layer of MOS transistors. Such a separation layer is often referred to as premetal dielectric (PMD) layer because it is deposited before any of the metal layers in a multilevel metal structure and is used to electrically isolate portions of the first deposited metal layer from the semiconductor substrate. BPSG films are commonly used as PMD layers because of their low dielectric constant, low stress, good adhesion properties and relatively low reflow temperature. Standard BPSG films are formed by introducing a phosphorus containing source and a boron containing source into a processing chamber along with the silicon and oxygen containing sources normally required to form a silicon oxide layer.

When used as a PMD layer, a BPGS film is deposited over a lower level polysilicon gate/interconnect layer that usually contains raised or stepped surfaces. The initially deposited film generally conforms to the topography of the poly layer and is typically planarized or flattened before an overlying metal layer is deposited. A standard reflow process, in which the oxide film is heated to a temperature at which it flows, may be employed to planarize the film. Alternatively, the layer may be partially reflowed and then subject to a chemical mechanical polishing (CMP) or etching technique.

As is known in the art, incorporating more phosphorus and boron into a BPSG typically results in better gapfill characteristics for a given reflow temperature. This effect must be balanced, however, with other concerns such as density of the BPSG layer. Higher dopant levels and lower reflow temperatures are also associated with a decrease in the density of the BPSG layer. Such a decreased density may, in turn, result in overetching during the formation of a contact structure in the layer.

FIGS. 1A through 1C show one example of an integrated circuit that is vulnerable to such an over etching problem. FIG. 1A is a top view of a portion of a contact structure formed through a BPSG layer and FIG. 1B is a cross sectional view of the contact structure along line A1–A2 shown in FIG. 1A. As shown in FIGS. 1A and 1B, adjacent polycide structures 12, 14 and 16 have been formed over a silicon substrate 10. Structures 12, 14 and 16 each include a first polysilicon layer 18 and an overlying tungsten silicide layer 20. A self-aligned silicon nitride layer 22 is deposited over the gate and a BPSG layer 24 is formed over the entire substrate. BPSG layer 24 has been reflowed and polished to a flat upper surface 26, and contact holes 28 that provide contact to the silicon substrate from an upper metalization layer have been etched between structures 12 and 14 and between structures 14 and 16 as well as in other places of the substrate that are not shown in either FIG. 1A or 1B. Also shown in FIGS. 1A and 1B are N-well 30, P-well 32, shallow trench isolation region 34 and source and drain regions 36. It should be noted that FIGS. 1A and 1B have not been drawn to scale and that certain features have been exaggerated in size relative to others for ease of illustration.

FIG. 1C is an enlarged view of area 38 shown in FIG. 1A. While FIG. 1C is drawn closer in scale than either of FIGS. 1A and 1B in order to better illustrate the problems faced in the formation of contacts 28, it is still not drawn to the correct scale. As shown in FIG. 1C, contact holes 28 are formed through the middle of high aspect ratio gaps 40 that exist between adjacent gate structures and are filled with BPSG material. In some applications, high aspect ratio (HAR) gaps are characterized by a top width 42 of between 0.05 and 0.09 microns, a bottom width 44 of between 0.02 and 0.05 microns and a sidewall angle 46 of between 85–89 degrees. With a gaps' aspect ratio defined as the ratio of it's height to the width at the center of the gap, the aspect ratio for such HAR gaps is typically between 6:1 to 10:1 in 0.13 and 0.10 micron feature size technology. As can be appreciated, semiconductor manufacturers are pushing current technology to the limit in order to fill such a high aspect ratio gap with BPSG layer 24 in a void free manner so that layer 24 also has other characteristics, e.g., appropriate dielectric constant, adhesion and density, necessary to produce working integrated circuits.

Ideally, contact holes 28 are characterized by smooth nearly vertical lines 40 throughout the entire contact area. After the contact holes are etched they are typically filled with a multilayer metal plug such as a titanium/titanium nitride/tungsten scheme as is known in the art.

In some applications contact holes 28 are subject to a contact clean step in order to remove oxidation and/or residue remaining from the contact etch step at the silicon contact surface prior to forming metallization within the holes. Such a contact clean step may be done by wet clean process (e.g., using a solution of ammonium hydroxide and hydrogen peroxide diluted in water), by plasma clean process or by using other techniques, such as ultrasonic or megasonic cleaning. Regardless of what technology is used, care must be taken during the clean step in order to ensure that the contact opening is not overetched thereby undesirably widening the contact holes.

As previously mentioned, the doping concentration of the BPSG layer and reflow temperature must be balanced against other concerns. Too high of a dopant concentration and/or too low of a reflow temperature will result in a less dense BPSG layer that has a high etch rate. In such a case, the BPSG layer is more susceptible to the overetching just described during the contact clean process.

Accordingly, as can be appreciated from the above, it is desirable to develop techniques that reduce the likelihood of overetching contact holes during the contact clean process.

BRIEF SUMMARY OF THE INVENTION

Embodiments of the present invention pertain to methods of reducing the likelihood that contact holes will be overetched during a contact clean process. According to one embodiment, after etching the contact holes but prior to removing residue and/or oxidation within the contact area of the holes via a contact clean process, the holes are subject to a nitrogen plasma that forms a thin nitrided layer on the inner surface of the etched hole. This nitrided layer has a higher etch selectivity to the contacts clean etch process than does the BPSG layer and thus helps prevent overetching of the contact opening during the preclean process.

In another embodiment, a thin layer of silicon nitride is deposited within the contact hole using an atomic layer deposition (ALD) process. In still other embodiments, a thin silicon nitride layer is deposited using chemical vapor deposition (CVD) techniques. In one embodiment, a plasma of silane ($SiH_4$) and either or both ammonia ($NH_3$) and molecular nitrogen ($N_2$) is employed to form the silicon nitride layer. The substrate is heated to a temperature between 200–400° C. during deposition of the layer. This CVD process may employ standard capacitively coupled electrodes, high density plasma techniques or remote plasma techniques.

These and other embodiments of the invention along with many of its advantages and features are described in more detail in conjunction with the text below and attached figures.

DETAILED DESCRIPTION OF THE INVENTION

Embodiments of the invention pertain to methods for forming contacts to a silicon substrate through a PMD layer and more particularly to methods that improve the etch selectivity of the PMD material surrounding the contact opening to the etchant used during a contact clean step ("improving a material's etch selectivity" to an etchant refers to decreasing the rate at which it is removed or etched by the etchant). The improved etch selectivity of the PMD material makes the material less susceptible to overetching problems during a contact clean step (also referred to herein as a "preclean step"). This, in turn, provides semiconductor manufacturers with a variety of options or larger process windows for certain individual processes of the overall process flow for a specific integrated circuit. For example, improving the etch selectivity of the PMD material within a contact hole that is exposed to the preclean etchant may enable a semiconductor manufacturer to perform a longer contact clean step than would otherwise be possible, incorporate more boron or phosphorus dopant into a BPSG PMD layer and/or reduce the temperature or length of the PMD layer reflow process.

Some embodiments of the invention include a nitridation step that exposes the contact hole to a nitrogen plasma or active nitrogen species generated from a plasma to incorporate nitrogen into a thin layer or outer skin of the exposed PMD layer surrounding the contact hole. Other embodiments form a thin layer of silicon nitride over the outer surface of the PMD layer within the contact hole. In both cases, the thin nitrided PMD layer or thin silicon nitride layer has a higher etch selectivity to the preclean etchant than an untreated PMD layer as well as a higher selectivity to the preclean etchant than the silicon oxide or other residue that may form at the silicon interface on the bottom of the contact hole. Thus, when the substrate having the contact hole is subjected to a contact clean step, the step is less likely to expand and over etch the contact hole.

To better illustrate the present invention, a process flow starting with deposition of a BPSG PMD layer over a substrate through the contact hole formation and the contact clean step mentioned above is set forth below. It is to be understood that this embodiment is for exemplary purposes only and a person of skill in the art will recognize other alternative and equivalent embodiments.

Figure 1B:
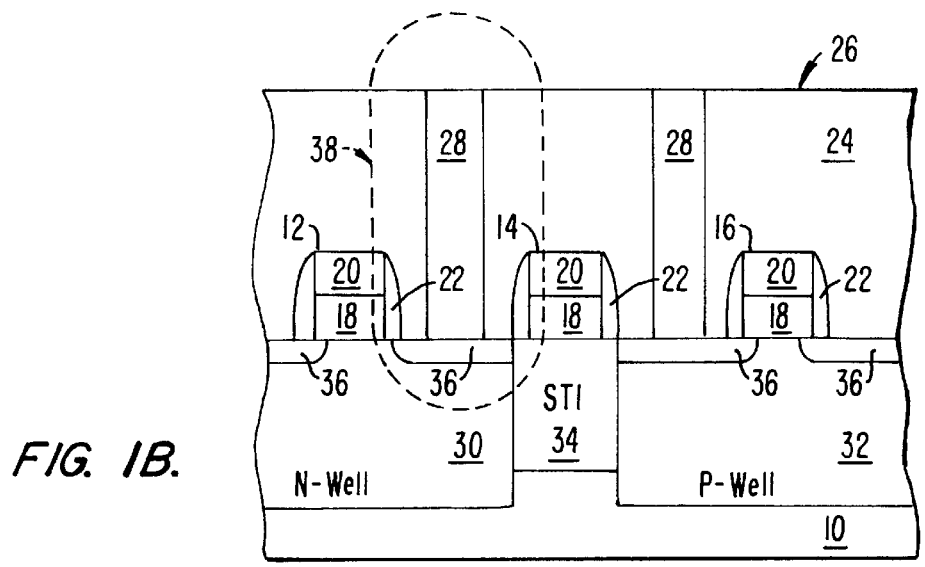
FIG. 1B is a cross sectional view of the contact structure shown in FIG. 1A.
Figure 1A:
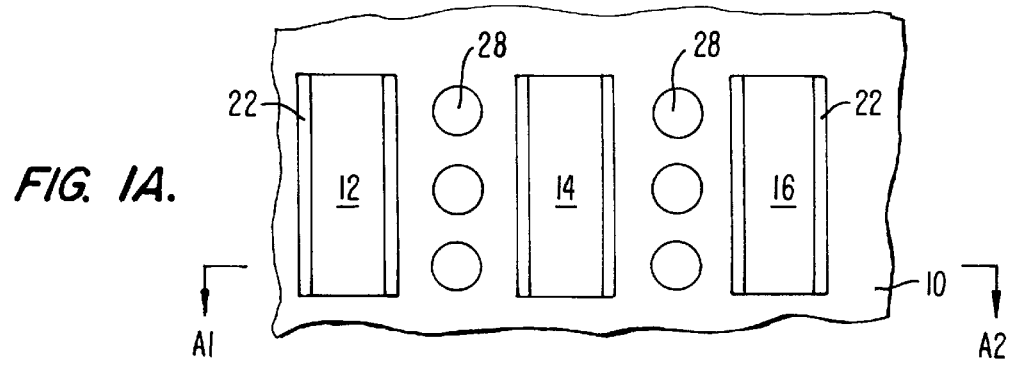
FIG. 1A is a top view of a portion of a contact structure according to the prior art.
Figure 1C:
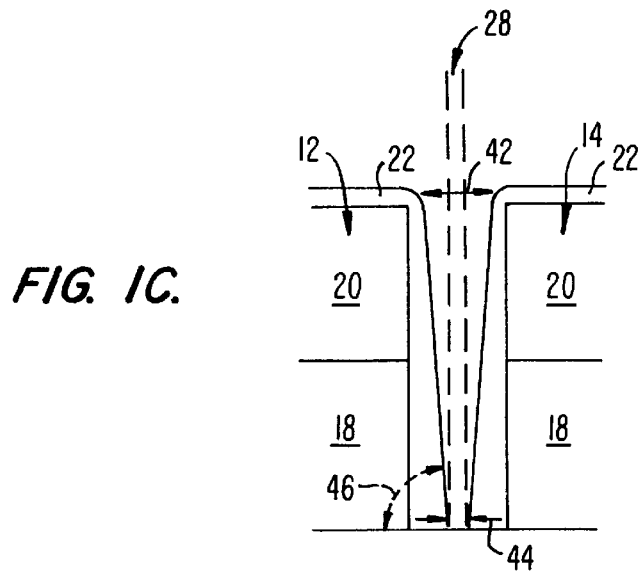
FIG. 1C is an enlarged view of area 38 shown in FIG. 1A.
Figure 2:
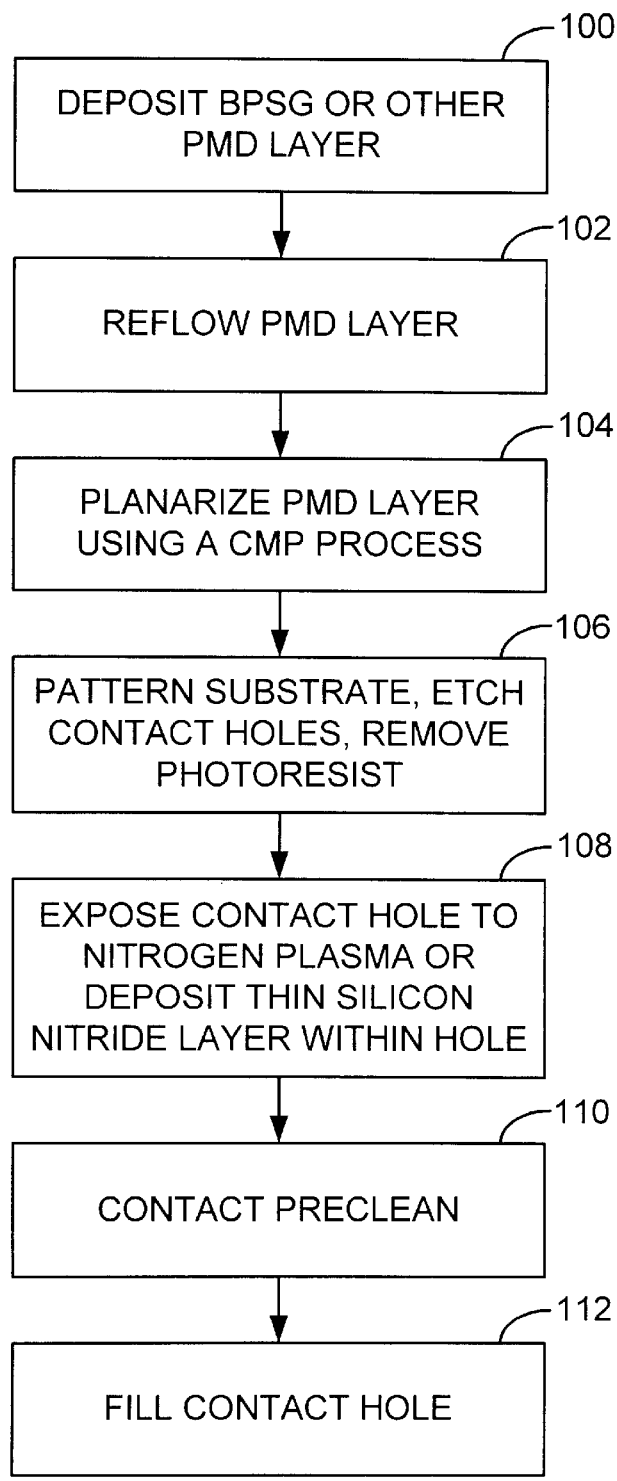
FIG. 2 is a flowchart illustrating the steps of one embodiment of the method of the present invention.

FIG. 2 is a flow chart illustrating the step according to one embodiment of the method of the invention and FIGS. 3A–3E are simplified cross sectional views of a semiconductor substrate undergoing processing according to some of the steps set forth in FIG. 2. Referring to both FIGS. 2 and 3A, step 100 includes the deposition of a BPSG gapfill layer 154 over raised structures 130 formed on a semiconductor substrate 150. Reised structures 130 may include gates 132 and polysilicon line 134 among other structures. In some embodiments, a thin silicon oxide, silicon nitride or silicon carbide lining layer 152 is formed over raised structures 130 prior to the deposition of BPSG layer 154.

Figure 3A:
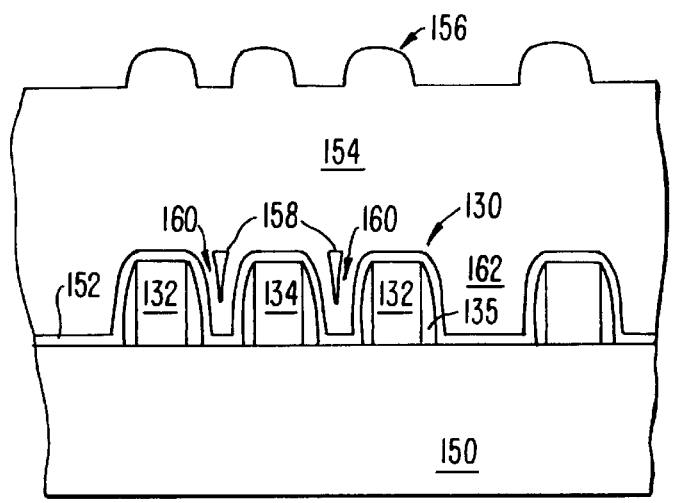
FIGS. 3A–3E are simplified cross-sectional views of a semiconductor substrate undergoing processing according to FIG. 2.

BPSG layer 154 is a generally conformal film that follows the underlying topography and thereby includes bumps 156 in the area above raised structures 130. Also shown in FIG. 3A are voids 158 that may form in BPSG layer 154 during its deposition if the aspect ratio (ratio of the height to width) of a gap between any two adjacent raised structures into which the BPSG layer is deposited is sufficiently high. As is common in the manufacture of actual integrated circuits, FIG. 3A shows voids 158 forming in high aspect ratio, narrow-width gaps 160 and not in low aspect ratio, wide-width gap 162.

Figure 3B:
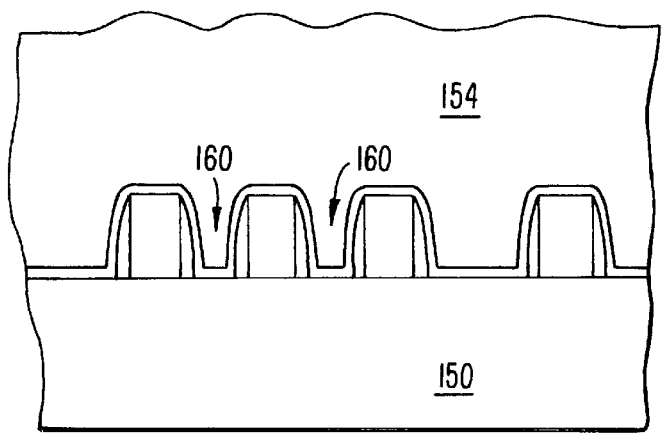

After deposition of BPSG layer 154 is complete, the layer is first reflowed to partially planarize the layer and fill in voids 158 (step 102). Reflow process 102 typically includes heating layer 154 above its glass transition temperature for a predetermined period of time. As evident in the FIG. 3B, the reflow process results in some flattening or planarization of layer 154 and, ideally, the filling of voids 158. Whether or not voids 158 are completely filled as is shown in FIG. 3B depends on the temperature, length and type of reflow process used, the shape and size of the voids and the boron and phosphorus concentrations of the BPSG layer among other factors.

Because of thermal budget constraints, it is generally desirable to flow layer 154 at a temperature and for a length of time that is sufficient to fill voids 158 but not sufficient to completely planarize the layer. As is known to those of skill in the art, layer 154 will flow more at higher boron and phosphorus concentrations, at higher reflow temperatures and during longer, as opposed to shorter heat steps.

Figure 3C:
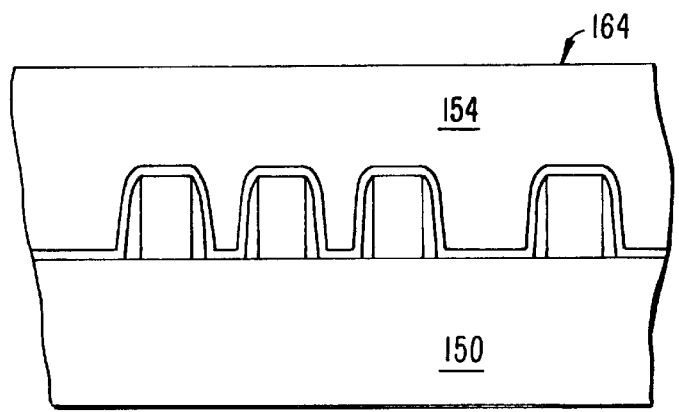
Figure 3D:
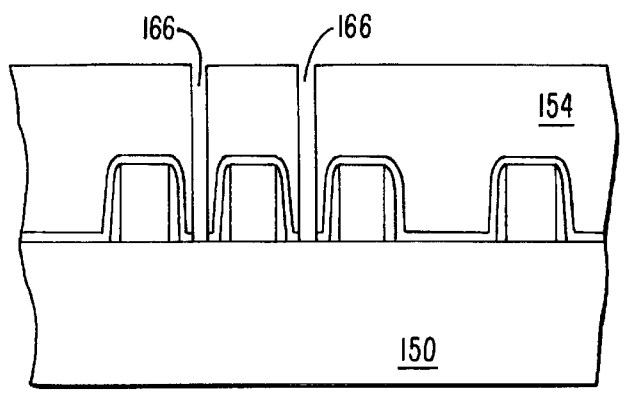

After layer 154 is reflowed, the layer is further planarized to an essentially flat surface 164 as shown in FIG. 3C using chemical mechanical polishing (CMP) techniques (step 104). Next, referring to FIG. 3D, contact holes 166 are etched through BPSG layer 154 in order to allow contact between the underlying silicon surface and an upper metallization layer (step 106). Standard photolithography steps are used in forming contact holes 166 as is known to those of skill in the art. After contact holes 166 are etched, they can be filled with tungsten or a similar conducting material.

Figure 3E:
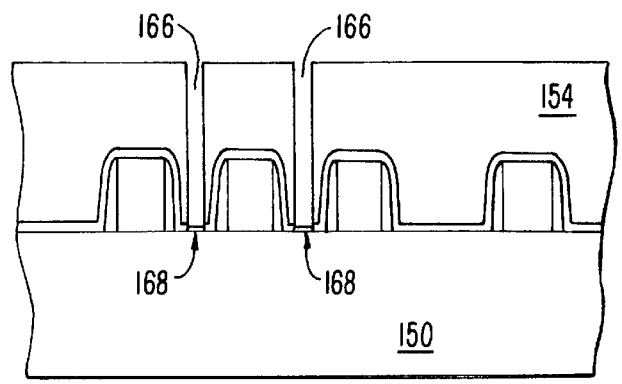

As shown in FIG. 3E, however, a thin layer of residue and/or oxidation 168 may remain or form at the bottom of the contact hole after the contact etch step. This residue and/or oxidation increases contact resistance of a subsequently formed contact, and if severe enough, can even prevent electrical contact from being made thereby resulting in an open circuit. Accordingly, embodiments of the invention perform a contact clean step (step 110) prior to filling the contact hole. Any of several different previously known contact clean steps can be used to remove residue/oxidation 168. For example, in one embodiment, the residue/oxidation is removed by dipping substrate 150 in a bath of SC-1 cleaning solution, manufactured by RCA. The SC-1 cleaning solution is a solution of ammonium hydroxide ($NH_4OH$) and hydrogen peroxide ($H_2O_2$) diluted in water in a ratio of 1 part $NH_4OH$, 4 parts $H_2O_2$ and 20 parts $H_2O$. Other cleaning solutions can be used in other embodiments. In still other embodiments, plasma etching techniques can be used such as exposing the contact hole to a plasma formed from $H_2$, $NH_3$ or a halogen etchant such as $NF_3$. In still further embodiments, a megasonic clean step can be used. In a megasonic clean step, very high frequencies (e.g., 700–1000 kHz) are used to generate controlled acoustic cavitation (formation and activity of bubbles) in a cleaning fluid. The controlled cavitation, which becomes acoustic steaming has sufficient energy to overcome particle adhesion forces thereby helping in the removal of etched particles by pushing the particles away so that they do not reattach to the material being cleaned. A megasonic clean, plasma etch or similar, non-wet clean step is preferred in some embodiments where the width and aspect ratio of the contact hole make it difficult for liquids to reach the bottom of the hole and etch the residue/oxidation.

Figure 4:
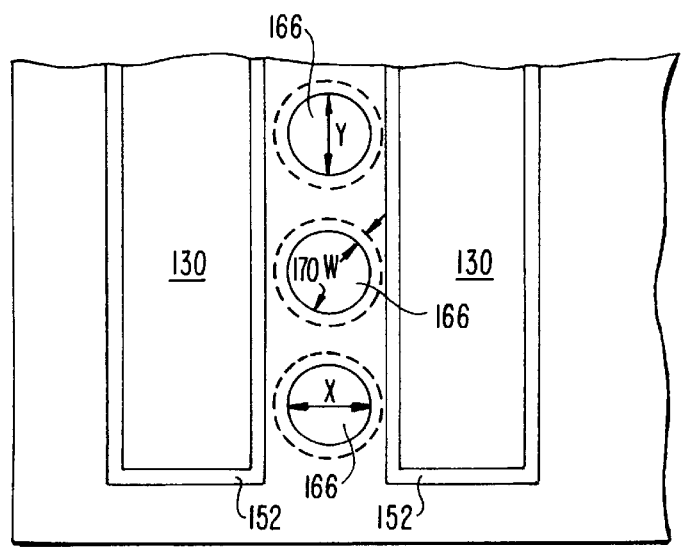
FIG. 4 is an enlarged top view of a partially formed integrated circuit shown in FIG. 3E.

Embodiments of the invention improve the etch selectivity of the sidewalls within contact hole 166 to the contact clean etchant as compared to the unwanted oxide build-up. This reduces the chances that undesirable widening will occur within the contact hole. FIG. 4 is an enlarged top view of the partially formed integrated circuit shown in FIG. 3E. As shown in FIG. 4, multiple contact holes 166 are etched between the raised structures 130. In previously known structures, each contact hole 166 may be overetched by an amount W depending on the density of BPSG layer 154 and the length of preclean etch step 110. When planned for, some overetching is tolerable. If overetching is severe, it may be stopped along the X-axis by layer 152 (especially if layer 162 is either a silicon nitride barrier layer or silicon carbide barrier layer that has a high etch selectivity to silicon oxide) or, if no layer 152 was deposited or layer 152 is a silicon oxide layer, the overetching may be stopped by silicon nitride sidewalls 135. Along the Y-axis, however, there is no silicon nitride or other material that presents a higher etch selectivity to the preclean etchant. Accordingly, previously known partially formed integrated circuits are particularly vulnerable to overetching problems in this direction.

Figure 5A:
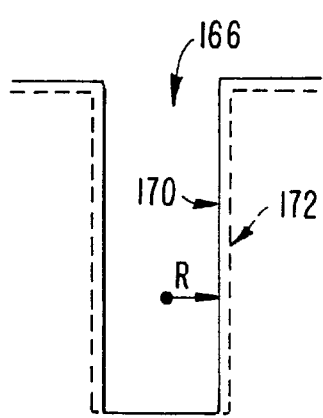
FIGS. 5A and 5B are simplified cross-sectional views of a contact hole after being treated according to different embodiments of the present invention.

Prior to the contact clean process, the method of the invention forms a material along inner sidewall 170 of etched contact 166 that has an etch selectivity to the preclean etchant that is higher than the etch selectivity of the as-deposited PMD layer (step 108). In one embodiment the higher etch selectivity material is formed by exposing the contact hole to a nitrogen plasma. As shown in FIG. 5A, this incorporates nitrogen into the exposed sidewall areas of the contact and generally does not result in a narrowing of the contact opening as film is not grown or deposited within the opening. The amount of nitrogen incorporation and depth of nitrogen incorporation (shown as region 172) depends on the length of time the contact hole is exposed to the plasma, the characteristics of the plasma, the temperature of the substrate and other factors. While not being limited to any particular theory, it is believed that the nitrogen plasma reacts with oxygen atoms bonded to silicon atoms to convert Si—O bonds to Si—N bonds thereby forming a thin silicon nitride or silicon oxynitride layer at sidewall surface 170.

In one embodiment, the nitriding step exposes the substrate to a plasma of $N_2$ for between 20 seconds and 5 minutes and in another embodiment between 30 seconds and 2 minutes. In other embodiments, other suitable nitrogen-containing sources may be used as can be determined by a person of skill in the art. The plasma may be formed in a high density plasma CVD chamber such as the Ultima HDP Chamber manufactured by Applied Materials. Alternatively, the plasma may be formed in other types of substrate processing chambers including capacitively-coupled plasma enhanced CVD chambers, ECR chambers and chambers that use microwave or remote plasma formation techniques among others.

When used in 0.13 to 0.10 micron technology, contact holes 166 may have a radius (R) of between 0.1 to 0.25 microns. Nitriding a thin layer of the PMD material defining the contact hole increases the dielectric constant of the material. Thus, it is generally desirable to keep the nitrided layer relatively thin in comparison to the contact hole. In one embodiment, nitrided region 172 extends between 10–100 Å inward from inner sidewall 170. In another embodiment, region 172 extends between 20–50 Å inward. Those skilled in the art will appreciate that the nitrogen concentration can vary throughout the nitrided region, generally ranging from a highest value at or near the surface of the nitrided region and diminishing to about 0.01 at. % or less at the interface between the nitrided and unnitrided region (i.e., as-deposited PMD material), and that the location of the interface is primarily a matter of defining the limit of the desired nitrogen concentration.

Figure 5B:
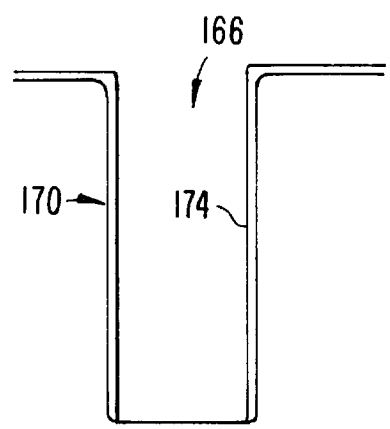

In other embodiments, a thin layer of silicon nitride 174 is deposited within contact hole 166 over sidewall surface 170 as shown in FIG. 5B. In one embodiment the thin silicon nitride layer is deposited using a CVD process. A variety of silicon nitride CVD techniques that are well known to those of skill in the art can be used to deposit layer 174. In one particular embodiment, flows of $SiH_4$ and $NH_3$ or $N_2$ are introduced into a plasma CVD chamber and a plasma is formed while the substrate is heated to a temperature between 200–400° C. In still another embodiment, an atomic layer deposition (ALD) process in which alternating flows of $SiCl_4$ and $NH_3$ are introduced into the chamber to form thin silicon nitride layer 174. After each flow, the chamber is purged with an inert gas in preparation for the introduction of the next flow. The approach grows a silicon nitride layer at a rate of approximately 1 Å per gas cycle. In one embodiment, the substrate is heated to between 200–400° C. and $SiCl_4$ and $NH_3$ or $N_2$ gas flows are introduced into the chamber for approximately 1 second before purging the chamber with an inert gas. Such an ALD technique has a benefit over standard CVD techniques in that it is better able to control the growth of a very thin (e.g., 3–10 Å) silicon nitride layer 174 that is desirable in some applications.

Having fully described several embodiments of the present invention, many other equivalent or alternative embodiments of the present invention will be apparent to those skilled in the art. For example, while the invention was described above with respect to forming a contact hole in a BPSG layer it is applicable to other types of PMD layers as well including fluorinated BPSG, phosphorus-doped silicate glass (PSG) and undoped silicate glass (USG). Similarly, fluorinated BPSG, the method of the invention may find uses in intermetal dielectric applications. For example, improving the etch resistance of via sidewalls formed to preclean plasmas used to remove oxidation at the bottom of the via. These equivalents and alternatives are intended to be included within the scope of the present invention.

What is claimed is:

1. A method of forming a contact in an integrated circuit between a first metalization layer and a silicon substrate, said method comprising:

forming a premetal dielectric layer over said silicon substrate;

etching a contact hole through said premetal dielectric layer, said contact hole having an inner surface that extends from a top of said contact hole to a bottom;

forming a nitrogen including layer on said inner surface;

removing residue and/or oxidation build-up within said contact hole at the silicon interface; and filling said contact hole with one or more conductive materials.

2. The method of claim 1 wherein said nitrogen including layer is formed by exposing said contact hole to a nitrogen-containing plasma.

3. The method of claim 1 wherein said nitrogen including layer is formed by depositing a layer of silicon nitride over said inner surface.

4. The method of claim 3 wherein said layer of silicon nitride is deposited by an atomic layer deposition process.

5. The method of claim 3 wherein said layer of silicon nitride is deposited by a chemical vapor deposition process.

6. The method of claim 1 wherein said premetal dielectric layer is a silicate glass layer doped with boron and phosphorus.

7. The method of claim 1 wherein said removing step comprises exposing said contact hole to a wet etchant.

8. The method of claim 1 wherein said removing step comprises exposing said contact hole to a plasma formed from an etchant gas.

9. A method of processing a substrate having a contact hole etched through a premetal dielectric layer to an upper surface of said substrate, said method comprising:

forming a nitrogen including layer on an inner surface of said contact hole; and thereafter, exposing said contact hole to an etchant to remove residue and/or oxidation build-up at said upper surface of said substrate within said contact hole;

wherein said etchant has a higher etch selectivity to said nitrogen including layer than to said residue and/or oxidation build-up.

10. The method of claim 9 wherein said nitrogen including layer is formed by exposing said contact hole to a nitrogen-containing plasma.

11. The method of claim 10 wherein said contact hole is exposed to said nitrogen-containing plasma for between 20 seconds and 5 minutes.

12. The method of claim 10 wherein said contact hole is exposed to said nitrogen-containing plasma for between 30 seconds and 2 minutes.

13. The method of claim 9 wherein said nitrogen including layer is formed by depositing a layer of silicon nitride over said inner surface.

14. The method of claim 13 wherein said layer of silicon nitride is deposited by an atomic layer deposition process.

15. The method of claim 13 wherein said layer of silicon nitride is deposited by a chemical vapor deposition process.

16. The method of claim 9 wherein said premetal layer is a BPSG or PSG layer.

17. A method of increasing the etch selectivity to a contact preclean etchant of a portion of a dielectric layer having a contact or via hole etched through said layer, said method comprising nitriding an inner sidewall surface of said contact hole by exposing said hole to a nitrogen-containing plasma prior to exposing said hole to said preclean etchant.

18. The method of claim 17 wherein said preclean etchant is generated from a plasma formed from $H_2$, $NH_3$, or a halogen-containing gas.

19. The method of claim 17 wherein said dielectric layer is a premetal dielectric layer and said hole is a contact hole etched through said layer to an upper surface of a silicon substrate.

20. A method of forming a contact in an integrated circuit between a first metalization layer and a silicon substrate, said method comprising:

forming a premetal dielectric layer over said silicon substrate;

etching a contact hole through said premetal dielectric layer, said contact hole having an inner surface that extends from a top of said contact hole to a bottom;

nitiding said inner surface of said contact hole by exposing said contact hole to a nitrogen-containing plasma;

thereafter, exposing said contact hole to an etchant to remove residue and/or oxidation build-up within said contact hole; and filling said contact hole with one or more conductive materials.

21. The method of claim 20 wherein said contact hole is exposed to said nitrogen-containing plasma for between 20 seconds and 5 minutes.

22. The method of claim 20 wherein said contact hole is exposed to said nitrogen-containing plasma for between 30 seconds and 2 minutes.

23. The method of claim 21 wherein said nitrogen-containing plasma consists of molecular nitrogen.

24. The method of claim 21 wherein said premetal dielectric layer is a silicate glass layer doped with boron and phosphorus.

* * * * *